United States Patent
Salatino et al.

[11] Patent Number: 5,887,343
[45] Date of Patent: Mar. 30, 1999

[54] DIRECT CHIP ATTACHMENT METHOD

[75] Inventors: Matthew M Salatino, Satellite Beach; S. James Studebaker; Mike Newton, both of Palm Bay; Dale R. Setlak, Melbourne, all of Fla.

[73] Assignee: Harris Corporation, Palm Bay, Fla.

[21] Appl. No.: 857,525

[22] Filed: May 16, 1997

[51] Int. Cl.⁶ ............................................ H05K 3/30
[52] U.S. Cl. .............................. 29/833; 29/721; 29/840; 156/64; 356/400
[58] Field of Search ............................. 29/832, 830, 833, 29/840; 430/5, 126, 311; 356/399, 400, 401; 156/64, 292, 308.4

[56] References Cited

U.S. PATENT DOCUMENTS

| | | | |
|---|---|---|---|
| 4,941,255 | 7/1990 | Bull | 29/833 |
| 5,237,393 | 8/1993 | Tominaga | 256/401 |
| 5,262,257 | 11/1993 | Fukuda et al. | 430/5 |
| 5,304,460 | 4/1994 | Fulton et al. | 430/311 |
| 5,442,240 | 8/1995 | Mukerji | 257/783 |
| 5,446,541 | 8/1995 | Akita et al. | 256/299 |
| 5,543,585 | 8/1996 | Booth et al. | 174/261 |
| 5,566,448 | 10/1996 | Bhatt et al. | 29/832 X |
| 5,591,480 | 1/1997 | Weisman et al. | 216/13 |
| 5,633,719 | 5/1997 | Oehlbeck et al. | 356/401 |
| 5,638,597 | 6/1997 | Cutting et al. | 29/830 |
| 5,679,493 | 10/1997 | Kai | 430/126 |
| 5,757,503 | 5/1998 | Brady et al. | 256/400 |
| 5,812,271 | 9/1998 | Kim | 356/401 |

*Primary Examiner*—Peter Vo
*Assistant Examiner*—Rick Kiltae Chang
*Attorney, Agent, or Firm*—Allen, Dyer, Doppelt, Milbrath & Gilchrist, P.A.

[57] ABSTRACT

A method is for making a chip package of a type including a carrier and a chip connected thereto using optical alignment techniques. One method includes the steps of: providing a transparent film having chip alignment and carrier alignment indicia thereon, optically detecting the chip through the transparent film and aligning the transparent film and the chip based upon the chip alignment indicia. Similarly, the method may include optically detecting the carrier through the transparent film and aligning the transparent film and the carrier based upon the carrier alignment indicia. In addition, the method further includes securing the chip, transparent film and carrier together, such as by providing a thermoplastic transparent film which may heated for adhesively securing the components. The transparent film may be a transparent z-axis conductive film, or a dielectric transparent film. The dielectric transparent film may be a z-axis anisotropic dielectric transparent film, or openings may be formed in the dielectric film and filled with conductive material to establish electrical contact between the chip and carrier pads.

32 Claims, 8 Drawing Sheets

DIRECT CHIP ATTACHMENT METHOD

FIELD OF THE INVENTION

The present invention relates to the field of electronics and, more particularly, to a fabrication method for an integrated circuit package and the resulting package.

BACKGROUND OF THE INVENTION

Integrated circuits (ICs) are widely used in many electronic devices. A typical IC includes a silicon die in which are formed a number of active semiconductor devices, such as transistors, and passive devices, such as resistors. The integrated circuit die must typically be connected to other circuit components. Accordingly, the IC is typically protected by a surrounding package, such as formed of molded plastic, and a plurality of leads extend outwardly from the package for electrical connection to associated components. In addition, ICs are becoming more complex while remaining the same size or also becoming smaller. Accordingly, more connections to external circuits may be desirable.

One advantageous method of protecting the IC with a package is the so-called direct chip attachment (DCA) method. According to DCA, the IC is attached face down directly to the printed circuit board or carrier. Electrical connections may be made by solder bumps which are reflowed between pads on the chip and corresponding pads on the printed circuit board, for example.

Alternately, as disclosed, for example, in U.S. Pat. No. 5,543,585 to Booth et al., an adhesive may be applied between the IC and substrate for mechanical and electrical connection. The patent also discloses an embodiment wherein conductive pegs are positioned on the pads, then a prepunched insulative adhesive film is fitted over the pads and applied to the substrate surface.

Unfortunately, complex and highly specialized equipment is needed to precisely align and connect the chip to the printed circuit board. Accordingly, conventional DCA is relatively expensive, in part, because the specialized equipment is suitable only for DCA and is not usable for other routine assembly procedures.

SUMMARY OF THE INVENTION

It is therefore an object of the present invention to provide a method for making a chip package without requiring specialized expensive assembly equipment.

This and other objects, features, and advantages according to the invention are provided by a method for making a chip package of a type comprising a carrier and a chip connected thereto using optical alignment techniques. The chip includes a plurality of chip pads on an outer surface, and the carrier includes a plurality of carrier pads on an outer surface. The method preferably comprises the steps of providing a transparent film, and forming chip alignment and carrier alignment indicia on the film. Moreover, the method preferably includes optically detecting the chip through the transparent film and aligning the transparent film and the chip based upon the chip alignment indicia. Similarly, the method may include optically detecting the carrier through the transparent film and aligning the transparent film and the carrier based upon the carrier alignment indicia. In addition, the method preferably further includes securing the chip, transparent film and carrier together. The chip is preferably aligned and joined to the film, and this structure is then aligned and joined to the carrier.

In other words, the present invention permits optical detection or viewing through the transparent film during assembly to ultimately align the chip pads and the carrier pads together. Accordingly, conventional equipment may be used to perform DCA without requiring specialized equipment.

In one embodiment, the transparent film is a thermoplastic film which may be heated to serve as an adhesive for the securing steps. Thus, the thermoplastic transparent film may be heated after alignment with the chip to tack or secure the film to the chip. Thereafter, the thermoplastic film may be reheated to adhesively secure the chip and film assembly to the carrier.

The chip has a smaller surface area than the carrier so that the carrier alignment indicia are preferably formed outside the area corresponding to the chip surface area to thereby remain in view, looking from the chip side, and after the chip is joined to the transparent film. In addition, the step of forming the alignment indicia may be accomplished by laser marking or printing, for example.

According to one embodiment, the transparent film may be a transparent z-axis conductive film to electrically connect the chip pads and the corresponding carrier pads. In another embodiment, the transparent film is a dielectric transparent film. The dielectric transparent film may be a z-axis anisotropic dielectric transparent film to facilitate capacitively coupling between the chip pads and the corresponding carrier pads and while avoiding cross-talk between adjacent pads. Alternately, openings may be formed in the dielectric film and filled with conductive material to establish electrical contact between the chip and carrier pads.

The chip may also include an exposed chip portion adjacent the chip pads. In this variation, the carrier and the transparent film each also have a corresponding opening for the exposed chip portion. Alternately, the film may be continuous over the exposed chip portion. The method may also include the step of encapsulating the chip, transparent film, and carrier in an encapsulating material.

Another method embodiment of the invention is for making a chip package of a type comprising a carrier and a chip connected thereto, the chip comprising a plurality of chip pads on an outer surface, and the carrier comprising a plurality of carrier pads on an outer surface. This method preferably comprises the steps of: providing a film, and forming alignment indicia thereon; aligning the chip and film based upon the alignment indicia; securing the aligned chip and film together; aligning the film and the carrier based upon the alignment indicia; and securing the aligned film and carrier together so that the chip and carrier are connected together and with the chip pads and carrier pads in alignment. In this embodiment the film need not be transparent.

Another aspect of the present relates to the chip package formed by the methods described above. The chip package preferably comprises: a chip including a plurality of chip pads on an outer surface; a carrier comprising a plurality of carrier pads on an outer surface; and a film positioned between the chip and the carrier, and wherein the film preferably has alignment indicia thereon. The film may be transparent for some embodiments, but need not be for other embodiments. The chip package is thus readily and relatively inexpensively formed using the DCA methods of the invention.

The film may be a thermoplastic film adhesively securing the chip and the carrier together. In addition, the film may be a z-axis conductive film to electrically connect the chip pads and the corresponding carrier pads. The film may also be a dielectric film. And the dielectric film may either have openings filled with conductive material, or have z-axis anisotropy for capacitive coupling.

The chip may have an exposed chip portion adjacent the chip pads, such as for sensor applications. Accordingly, the carrier and the transparent film will each have a corresponding opening for the exposed chip portion, or the film may be continuous over the exposed chip portion. Of course, an encapsulating material may surround the chip, transparent film, and carrier.

DETAILED DESCRIPTION OF THE PREFERRED EMBODIMENTS

Figure 1:
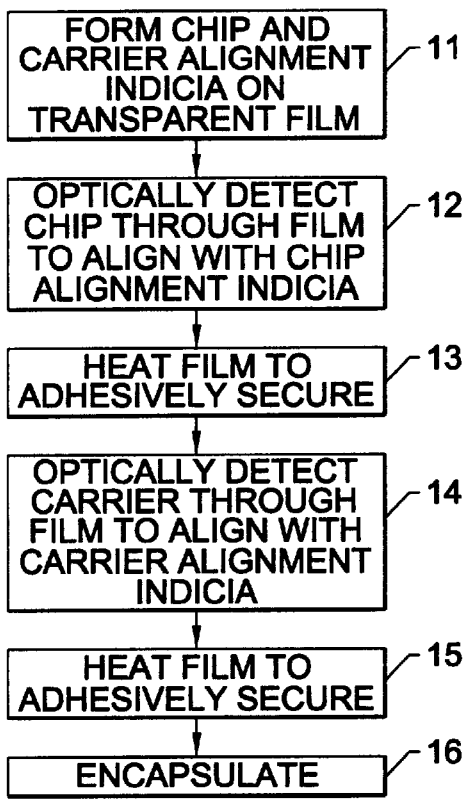
FIG. 1 is a flowchart of a method in accordance with the invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and double prime notation are used to indicate similar elements in alternate embodiments.

Referring first to FIGS. 1–5, a method in accordance with the present invention is described. The method is directed to making a chip package of a type comprising a carrier 30 and a chip 20 connected thereto using optical alignment techniques. The chip 20 includes a plurality of chip pads 21 on an outer surface, and the carrier includes a plurality of carrier pads 31 on an outer surface as would be readily appreciated by those skilled in the art. The method comprises the steps of providing a transparent film 40, and forming chip alignment indicia 42 and carrier alignment indicia 43 on the film (Block 11). The indicia 42, 43 can be formed by any of a number of conventional precision marking techniques including printing, laser marking, etc. as would be readily understood by those skilled in the art.

Figure 2:
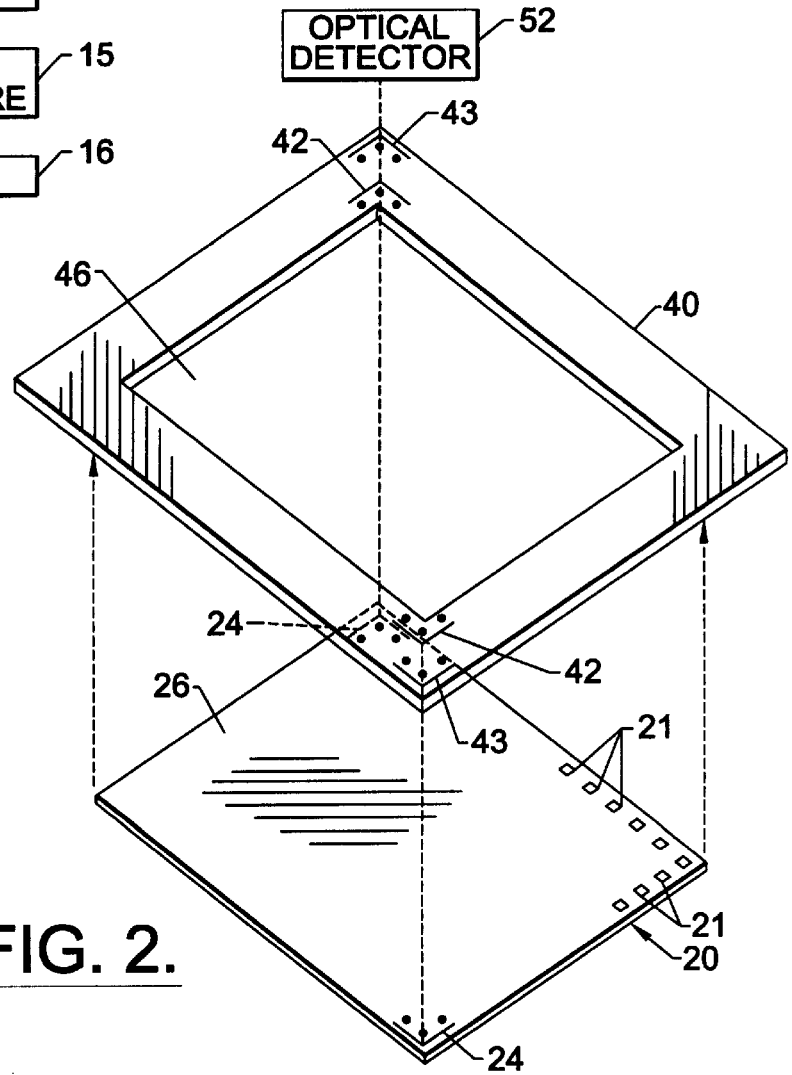
FIGS. 2–5 are perspective views indicating steps in the method in accordance with the invention.

Referring more particularly to FIG. 2, the method includes optically detecting the chip through the transparent film 40 and aligning the transparent film and the chip based upon the chip alignment indicia (Block 12). The schematically illustrated optical detector 52 performs the optical detection. Those of skill in the art will readily recognize that conventional optical detection and placement systems may be used. In the illustrated embodiment, alignment marks or indicia 24 are provided on the integrated circuit 20; however, those of skill in the art will readily recognize that known patterns or surface features on the integrated circuit 20, for example, may be used in combination with known offsets from the chip alignment indicia 42 on the transparent film 40. Accordingly, alignment between the transparent film 40 and the chip 20 can be readily made using the alignment indicia 42 and conventional location and placement techniques and equipment.

Figure 3:
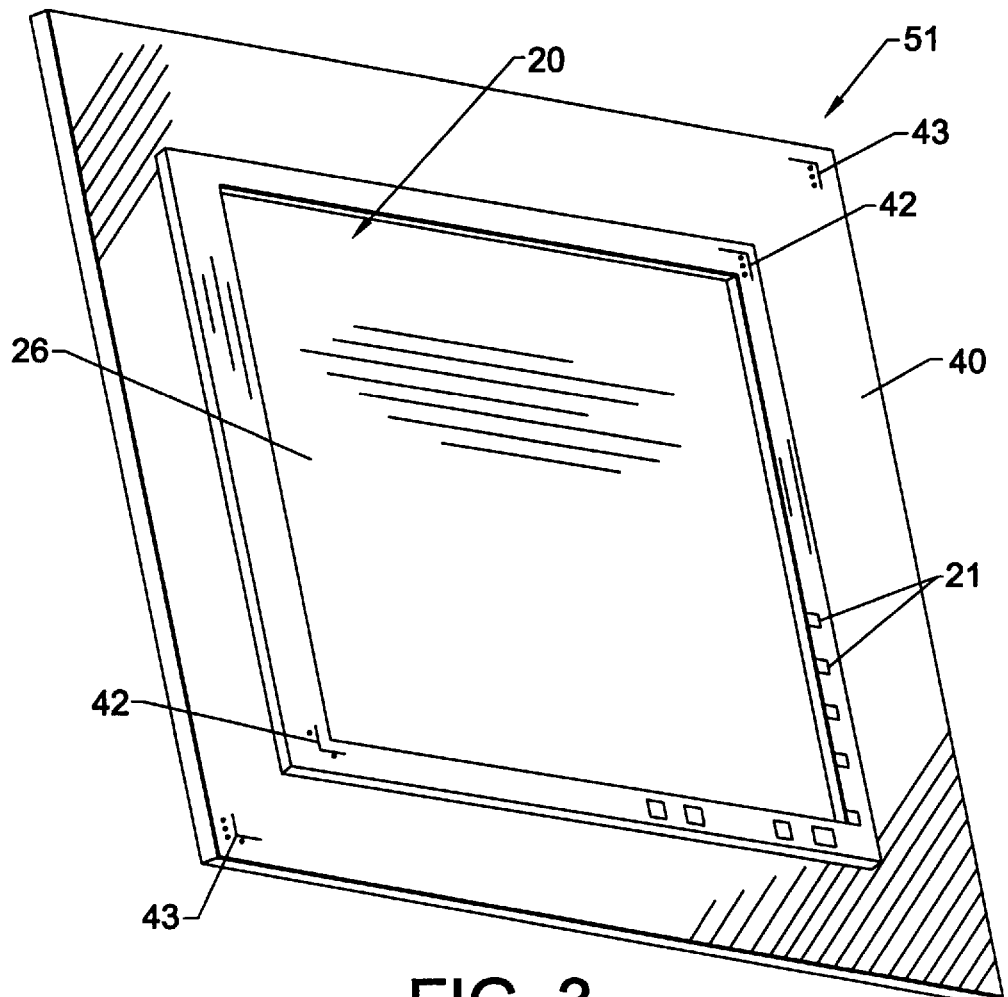
Figure 4:
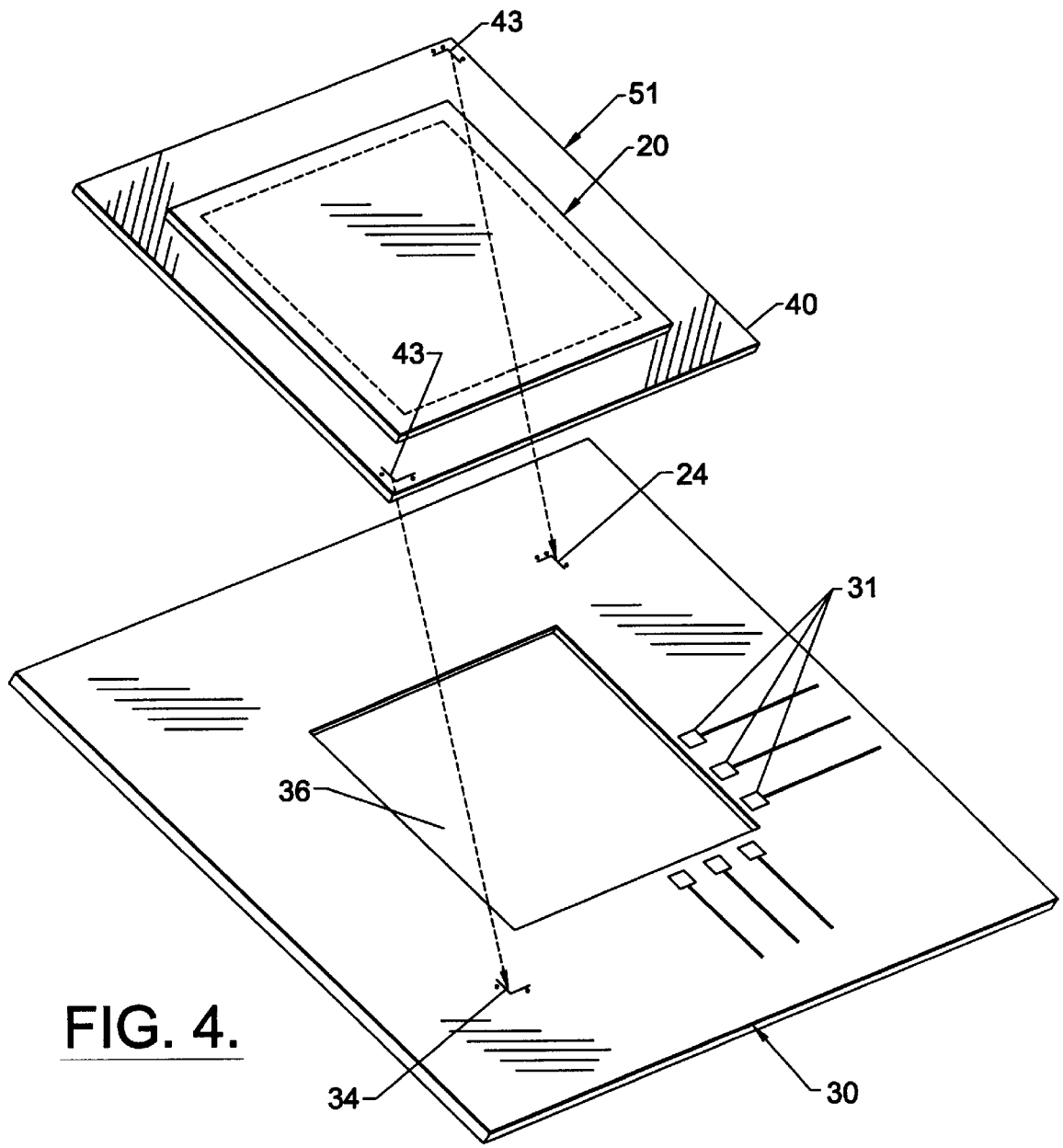

In one embodiment of the invention, the transparent film 40 comprises a thermoplastic material which when heated functions as an adhesive or becomes tacky as will be appreciated by those skilled in the art. Accordingly, the aligned film 40 and chip 20 may be joined by heating the thermoplastic film 40 (Block 13) producing the first assembly 51 as shown in FIG. 3.

The first assembly 51 may be inverted, and aligned with the carrier 30 by optically detecting the carrier through the transparent film 40 and aligning the transparent film and the carrier based upon the carrier alignment indicia 43 (Block 14). In the illustrated embodiment, alignment marks or indicia 34 are also on the carrier 30, although those of skill in the art will recognize that the alignment may be made based on known patterns on the carrier, and predetermined offsets to the carrier indicia 43, for example.

Of course, the carrier indicia 43 are desirably positioned on the transparent film 40 to be exposed outside the periphery of the chip 20 so that they may be viewed to align the assembly 51 and the carrier. In other words, the carrier indicia 43 are positioned on the transparent film 40 to lie outside a boundary defined by the chip 20.

Figure 5:
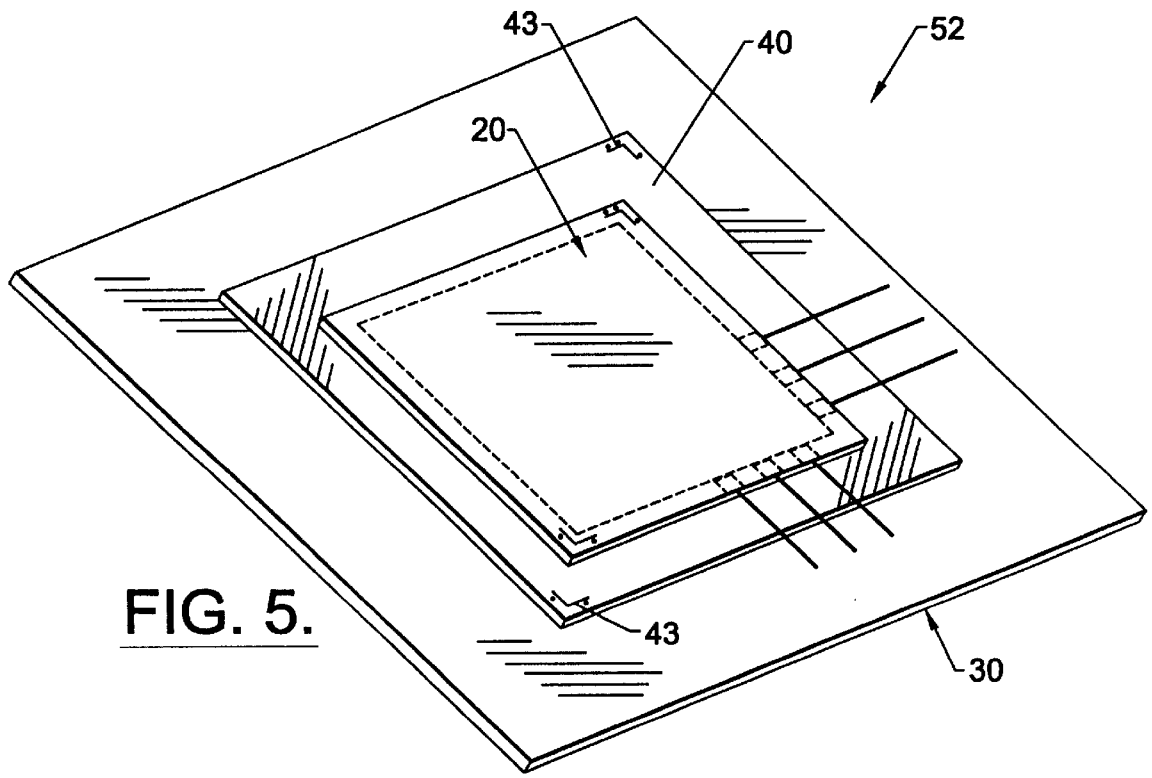

For the embodiment using the thermoplastic transparent film 40, the second assembly 52 shown in FIG. 5 may be heated to adhesively secure the transparent film and carrier together (Block 15). Those of skill in the art will recognize that other methods of securing or adhesively securing the film to the chip and to the carrier are also contemplated by the present invention. The thermoplastic film 40 does provide an advantage in terms of ease of use. The second assembly 52 may be encapsulated within a plastic material (Block 16) as would also be readily appreciated by those skilled in the art.

The method of the present invention permits optical detection or viewing through the transparent film 40 during assembly to ultimately align the chip pads 21 and the carrier pads 31 together. The chip 20 is aligned and joined to the film 40, and this first assembly 51 is then aligned and joined to the carrier 30. Accordingly, conventional equipment may be used to perform DCA without requiring specialized equipment as has been used in the past for DCA. The DCA formed package offers a number of significant advantages as will be readily understood by those skilled in the art.

Figure 6:
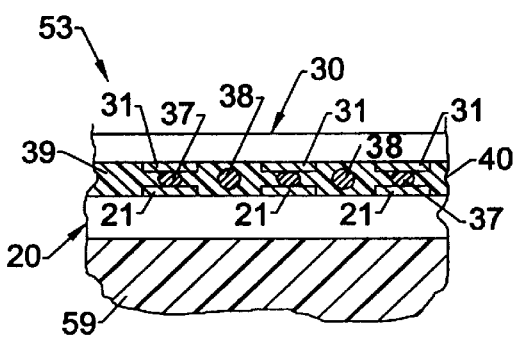
FIG. 6 is a schematic cross-sectional view of a portion of a first embodiment of a chip package in accordance with the present invention.

A number of different materials having advantageous properties may be used for the transparent film 40. In the embodiment of a package 53 partially illustrated in FIG. 6, the transparent film 40 may be a transparent z-axis conductive film as to electrically connect the chip pads 21 and the corresponding carrier pads 31. The z-axis material is schematically illustrated in the cross-sectional view of FIG. 6 and includes electrically conductive particles 37, 38 in a reticulated compressible matrix 39, wherein the material between the pads is compressed so that the particles 31 between the opposing pads electrically connect the pads. The particles 38 in the other portions of the matrix material 39 are not connected and, hence, these portions remain insulating. As also shown in the package 53 of FIG. 6, a plastic encapsulating material 59 may cover the back portion of the chip 20. Suitable z-axis conductive transparent films 40 are widely known as would be appreciated by those skilled in the art and these materials require no further discussion herein.

For this embodiment, the transparent film 40 will have chip alignment indicia aligned with the chip 20, such as by being positioned with a predetermined offset from one or more known features of the chip as would be readily appreciated by those skilled in the art. Similarly, the transparent film 40 will have carrier alignment indicia 43 aligned with the carrier as would also be readily appreciated by those skilled in the art.

Figure 7:
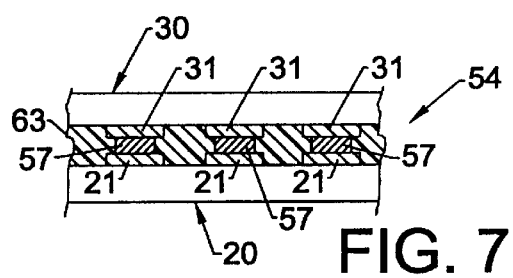
FIG. 7 is a schematic cross-sectional view of a portion of a second embodiment of a chip package in accordance with the present invention.

Turning now to the package 54 shown in FIG. 7, another transparent film 63 and its use are explained. In this embodiment, the transparent film 63 is a dielectric transparent film. Openings may be formed in the dielectric film 63 after it is positioned on the chip 20, and these openings filled with conductive material 57 to establish electrical contact between the chip pads 21 and carrier pads 31 as would be readily understood by those skilled in the art.

Figure 8:
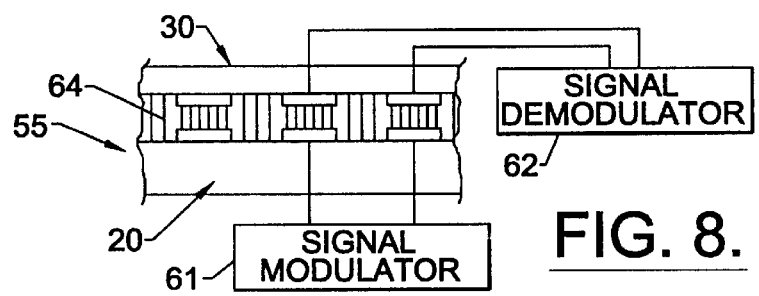
FIG. 8 is a schematic cross-sectional view of a portion of a third embodiment of a chip package in accordance with the present invention.
Figure 9:
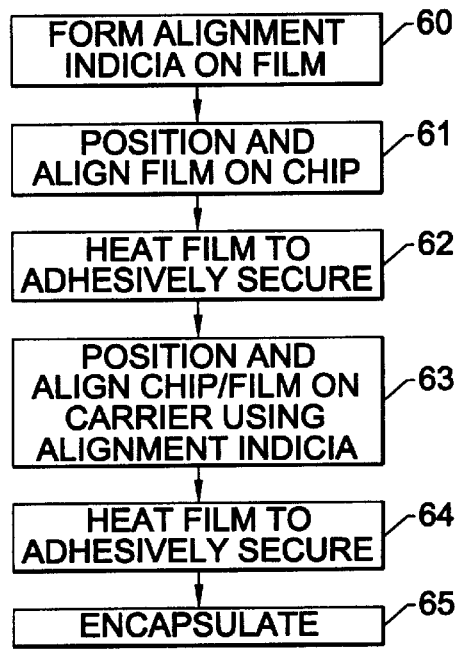
FIG. 9 is a flowchart of another method embodiment in accordance with the invention.
Figure 10:
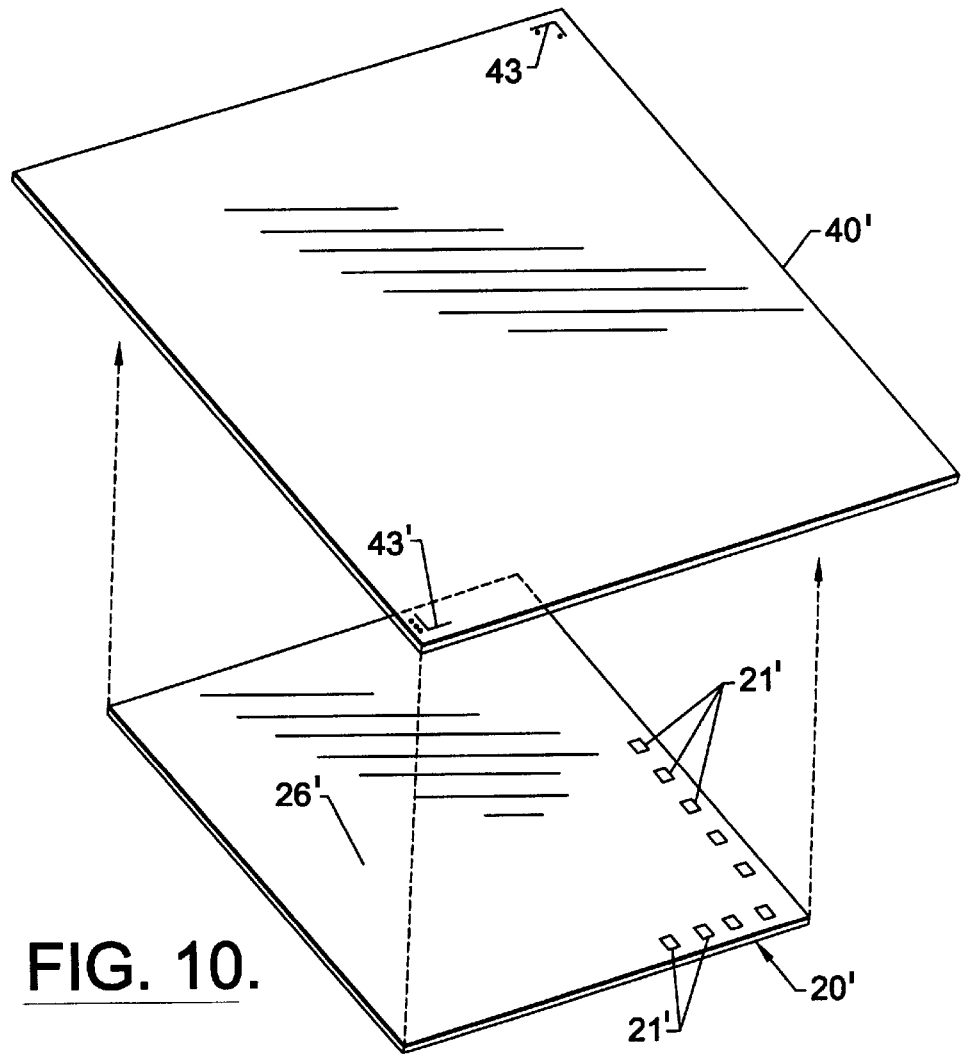
FIGS. 10–13 are perspective views indicating steps in the method as in the flowchart of FIG. 9.
Figure 11:
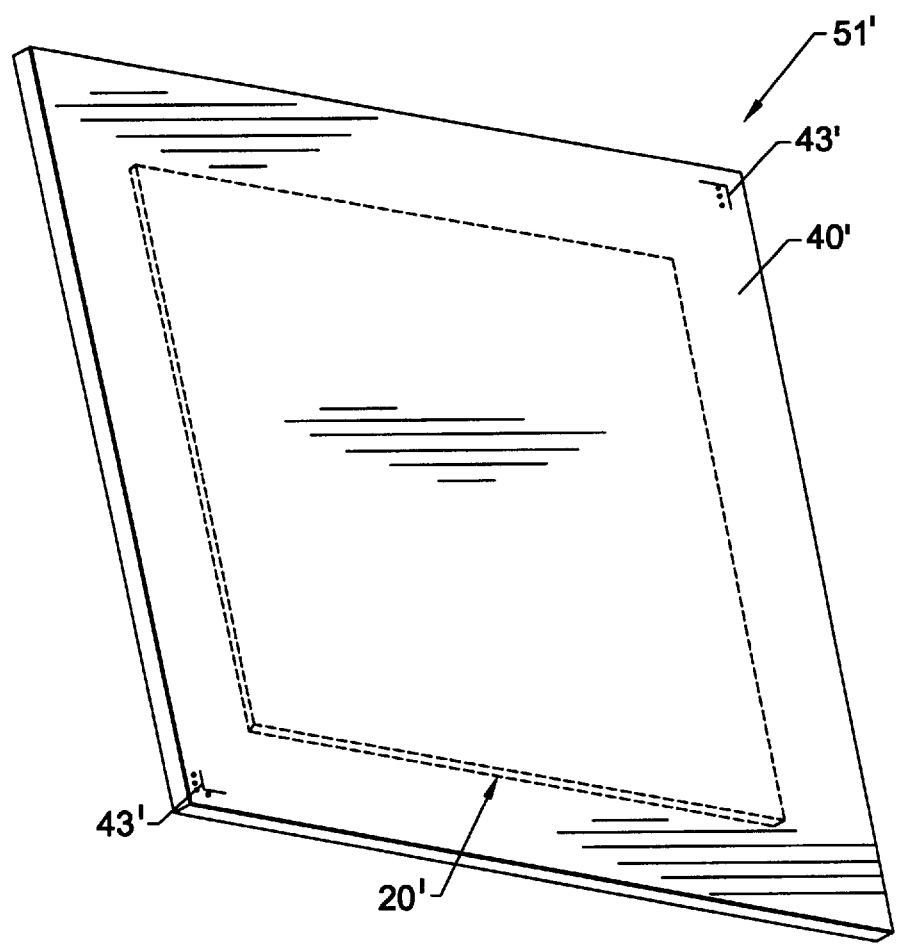
Figure 12:
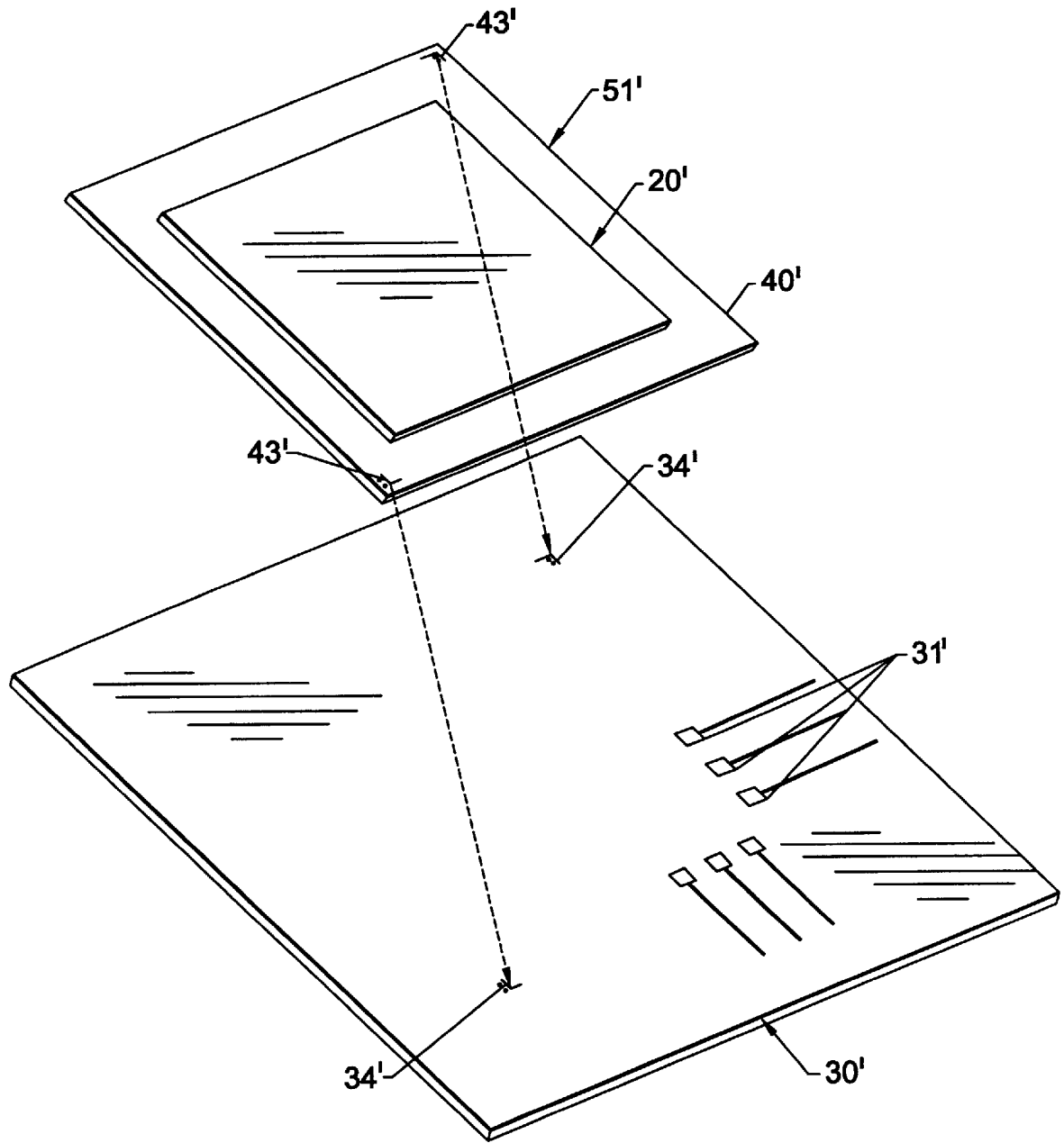
Figure 13:
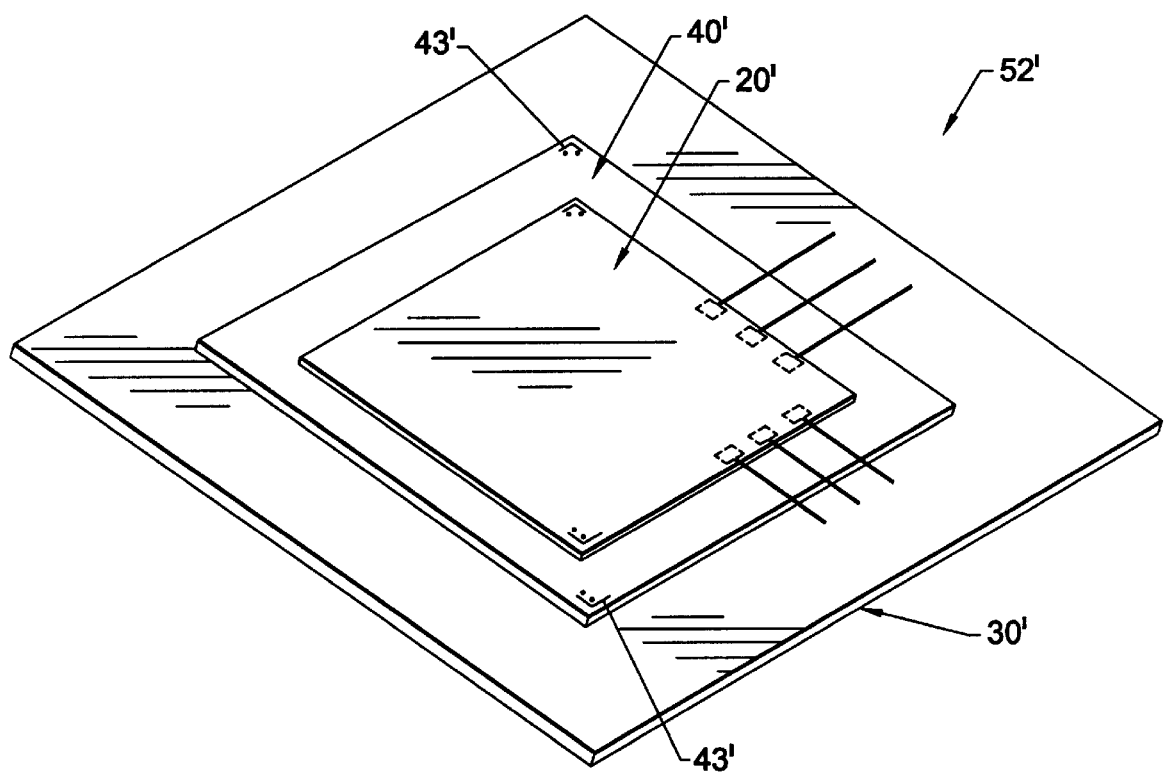

Yet another embodiment of a package 55 in accordance with the present invention is understood with further reference to FIG. 8. In this embodiment, the transparent film 64 is a z-axis anisotropic dielectric film to facilitate capacitive coupling between the chip pads 21 and the corresponding carrier pads 31 and while avoiding cross-talk between adjacent pads. In other words, the film 64 may have a high dielectric value in the regions between opposing pads as indicated by the closer spaced vertical lines, and a lower dielectric value in other surrounding portions. The z-axis dielectric may permit capacitive coupling between the carrier 30 and the chip 20 using illustrated signal modulator 61 and signal demodulator 62 as would be readily understood by those skilled in the art. The capacitive coupling may have desirable benefits for electrically isolating the chip 20 as would also be readily appreciated by those skilled in the art, especially where the chip 20 may be subject to human contact.

The film 64 of the package 55 may comprise oriented dielectric particles in a surrounding matrix as would be readily understood by those skilled in the art. For example, the film 64 may comprise barium titanate in a polyimide matrix. The film 64 may also be formed by selectively etching openings in the low dielectric material aligned with the pads, and regions of high dielectric material may then be formed in the openings. The chip package 55 is thus readily and relatively inexpensively formed using the method of the invention.

Returning again briefly to FIGS. 2–5, the chip 20 may also include an exposed chip portion 26 adjacent the chip pads 21. Of course, other configurations are also possible as contemplated by the present invention. In the illustrated embodiment, the carrier 30 and the transparent film 40 each also have a corresponding opening 36, 46 for the exposed chip portion 26. In the illustrated embodiment, the chip pads 21 surround the exposed chip portion 26 and the pads are protected by the carrier 30. For example, the present invention may be applicable for packaging an integrated circuit fingerprint sensor of a type having a sensing portion for finger contact. Other sensors, as well as other types of integrated circuits may also desirably have an exposed chip portion 26 as would be readily understood by those skilled in the art.

In addition, for some embodiments of sensors, for example, it may be desirable that the film 40 completely cover the exposed upper surface portion rather than have the central opening as in this illustrated embodiment. A complete covering may be particularly desirable for a fingerprint sensor using the z-axis anisotropic film 64 wherein the film also serves to prevent defocussing of the electric fields as will be readily appreciated by those skilled in the art.

Turning now to FIGS. 9–13 another embodiment of a DCA method in accordance with the invention is described. This embodiment is based upon using conventional placement equipment where the position of certain parts is precisely known. Accordingly, alignment marks or indicia 43' may be made on a thermoplastic film 40' (Block 60). At Block 61 the film 40' is aligned and positioned onto the chip 20' (FIGS. 11 and 12), based upon an accurate knowledge of the location of the chip and using the indicia 43' to determine the precise positioning of the film as will be readily appreciated by those skilled in the art.

At Block 62 the film 40' is heated to adhesively secure the chip 20' and film together and forming the first assembly 51'. It should be noted that in this embodiment, there is no central exposed portion of the chip and no need for the corresponding openings in the carrier 30'. The assembly 51' is inverted and positioned on the carrier 30' at Block 63 and as shown with particular reference to FIGS. 12 and 13. The alignment may be made using the illustrated indicia 43' and by knowing the precise location of the carrier 30' as would be readily appreciated by those skilled in the art.

The thus formed second assembly 52' may then be heated at Block 64 so that the thermoplastic film 40' adhesively joins the first assembly 51' to the carrier 30'. The second assembly 52' may be encapsulated (Block 65).

In this embodiment of the invention, the film 40' is not necessarily transparent. In addition, a single set of indicia 43' may be used to precisely determine the location of the film 40' (when joining the film and chip together) and then used again to precisely determine the location of the assembly 51' when securing same to the carrier 30' as would be readily understood by those skilled in the art. Accordingly, the thus-formed device 52' may include only a single set of indicia, and may not be transparent in this embodiment.

The other elements in FIGS. 10–13 not specifically mentioned are indicated with prime notation and are similar to those elements labeled with the same numbers described above with reference to FIGS. 2–5. Accordingly, these other elements require no further discussion herein.

As would also be readily understood by those skilled in the art, the present invention may also be applicable to a wide range of chip packaging needs, and may be used in place of conventional DCA using specialized equipment. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a chip package comprising a carrier and a chip connected thereto, the chip having a first outer surface and comprising a plurality of chip pads on the first outer surface of the chip, and the carrier having a first outer surface and comprising a plurality of carrier pads on the first outer surface of the carrier, the chip having edges adjacent the first outer surface defining a boundary of the chip, the method comprising the steps of:

provide a transparent film, and forming chip alignment indicia and carrier alignment indicia thereon, and with the carrier alignment indicia being positioned to lie outside the boundary of the chip;

optically detecting the chip through the transparent film and aligning the transparent film and the chip based upon the chip alignment indicia;

securing the first outer surface of the aligned chip and the transparent film together;

optically detecting the carrier through the transparent film and aligning the transparent film and the carrier based upon the carrier alignment indicia; and securing the aligned transparent film and the first outer surface of the carrier together so that the first outer surface of the chip and the first outer surface of the carrier are connected together with the transparent film therebetween and with the chip pads and carrier pads in alignment.

2. The method according to claim 1 wherein the step of providing the transparent film comprises providing a thermoplastic transparent film, and wherein the step of securing the first outer surface of the aligned chip and the transparent film together comprises heating the thermoplastic transparent film to adhesively secure the aligned first outer surface of the chip and the transparent film together.

3. The method according to claim 1 wherein the step of providing the transparent film comprises providing a thermoplastic transparent film, and wherein the step of securing the aligned transparent film and the first outer surface of the carrier together comprises heating the thermoplastic transparent film to adhesively secure the aligned transparent film and the first outer surface of the carrier together.

4. The method according to claim 1 wherein the step of forming the chip alignment and carrier alignment indicia comprises forming the chip alignment and carrier alignment indicia by at least one of laser marking, and printing.

5. The method according to claim 1 wherein the transparent film has a thickness defining a z-axis direction extending between the first outer surface of the chip and the first outer surface of the carrier; and wherein the step of providing the transparent film comprises providing a transparent z-axis conductive film to electrically connect the aligned chip pads and corresponding carrier pads.

6. The method according to claim 1 wherein the step of providing the transparent film comprises providing a dielectric transparent film.

7. The method according to claim 6 wherein the transparent film has a thickness defining a z-axis direction extending between the first outer surface of the chip and the first outer surface of the chip carrier, and wherein the step of providing the dielectric transparent film comprises providing a z-axis anisotropic dielectric transparent film to facilitate capacitively coupling between the aligned chip pads and corresponding carrier pads and while avoiding cross-talk between adjacent pads.

8. The method according to claim 6 further comprising the steps of:

forming openings in the dielectric transparent film aligned with the chip pads;

filling the openings with a conductive material; and electrically connecting the chip pads to the carrier pads using the conductive material.

9. The method according to claim 1 wherein the carrier and the transparent film have respective aligned openings defining an exposed chip portion on the first outer surface of the chip adjacent the chip pads.

10. The method according to claim 1 wherein the carrier has an opening defining an exposed chip portion on the first outer surface of the chip adjacent the chip pads and wherein the transparent film is continuous over the exposed chip portion.

11. The method according to claim 1 further comprising a step of encapsulating the chip, transparent film, and carrier in an encapsulating material.

12. A method for making a chip package comprising a carrier and a chip connected thereto, the chip having a first outer surface and comprising a plurality of chip pads on the first outer surface of the chip, and the carrier having a first outer surface and comprising a plurality of carrier pads on the first outer surface of the chip, the method comprising the steps of:

providing a transparent film;

viewing through the transparent film to align the chip and the transparent film;

viewing through the transparent film to align the carrier and the transparent film; and securing the chip, transparent film and carrier together so that the first outer surface of the chip and the first outer surface of the carrier are connected together with the transparent film therebetween and with the chip pads and carrier pads in alignment.

13. The method according to claim 12 wherein the step of securing the chip, transparent film and carrier together comprises the step of securing the transparent film and the first outer surface of the chip together after aligning the transparent film and the first outer surface of the chip, and wherein the step of securing the chip, transparent film and carrier together comprises the step of securing the transparent film and the first outer surface of the carrier together after aligning the transparent film and the first outer surface of the carrier.

14. The method according to claim 12 wherein the transparent film has a thickness defining a z-axis direction extending between the first outer surface of the chip and the first outer surface of the carrier, and wherein the step of providing the transparent film comprises providing a transparent z-axis conductive film to electrically connect the chip aligned pads and corresponding carrier pads.

15. The method according to claim 12 wherein the step of providing the transparent film comprises providing a dielectric transparent film.

16. The method according to claim 15 wherein the transparent film has a thickness defining a z-axis direction extending between the first outer surface of the chip and the first outer surface of the carrier, and wherein the step of providing the dielectric transparent film comprises providing a z-axis anisotropic dielectric transparent film to facilitate capacitively coupling between the chip aligned pads and corresponding carrier pads and while avoiding cross-talk between adjacent pads.

17. The method according to claim 15 further comprising the steps of:

forming openings in the dielectric transparent film aligned with the chip pads;

filling the openings with a conductive material; and electrically connecting the chip pads to the carrier pads using the conductive material.

18. The method according to claim 12 wherein the carrier and the transparent film have respective aligned openings defining an exposed chip portion on the first outer surface of the chip adjacent the chip pads.

19. The method according to claim 12 wherein the carrier has an opening defining an exposed chip portion on the first outer surface of the chip adjacent the chip pads, and wherein the transparent film is continuous over the exposed chip portion.

20. The method according to claim 12 further comprising the step of encapsulating the chip, transparent film, and carrier in an encapsulating material.

21. A method for making a chip package comprising a carrier an a chip connected thereto, the chip having a first outer surface and comprising a plurality of chip pads on the first outer surface of the chip, and the carrier having a first outer surface and comprising a plurality of carrier pads on the first outer surface of the carrier, the method comprising the steps of:

provide a film, and forming alignment indicia thereon;

aligning the chip and film based upon the alignment indicia;

securing the first outer surface of the aligned chip and film together;

aligning the film and the carrier based upon the alignment indicia; and securing the aligned film and first outer surface of the carrier together so that the first outer surface of the chip and the first outer surface of the carrier are connected together with the film therebetween and with the chip pads and carrier pads in alignment.

22. The method according to claim 21 wherein the step of providing the film comprises providing a transparent film.

23. The method according to claim 21 wherein the step of providing the film comprises providing a thermoplastic film, and wherein the step of securing the first outer surface of the aligned chip and film together comprises heating the film to adhesively secure the first outer surface of the aligned chip and film together.

24. The method according to claim 21 wherein the step of providing the film comprises providing a thermoplastic film, and wherein the step of securing the aligned film and first outer surface of the carrier together comprises heating the thermoplastic film to adhesively secure the aligned film and first outer surface of the carrier together.

25. The method according to claim 21 wherein the step of forming the alignment indicia comprises forming the alignment indicia by at least one of laser marking, and printing.

26. The method according to claim 21 wherein the film has a thickness defining a z-axis direction extending between the first outer surface of the chip and the first outer surface of the carrier, and wherein the step of providing the film comprises providing a z-axis conductive film to electrically connect the chip pads and corresponding carrier pads.

27. The method according to claim 21 wherein the step of providing the film comprises providing a dielectric film.

28. The method according to claim 27 wherein the film has a thickness defining a z-axis direction extending between the first outer surface of the chip and the first outer surface of the carrier, and wherein the step of providing the dielectric film comprises providing z-axis anisotropic dielectric film to facilitate capacitively coupling between the chip pads and the corresponding carrier pads and while avoiding cross-talk between adjacent pads.

29. The method according to claim 27 further comprising the steps of:

forming openings in the dielectric film aligned with the chip pads;

filling the openings with a conductive material; and electrically connecting the chip pads to the carrier pads using the conductive material.

30. The method according to claim 21 wherein the carrier and the film have respective aligned openings defining an exposed chip portion on the first outer surface portion of the chip adjacent the chip pads.

31. The method according to claim 21 wherein the carrier has an opening defining an exposed chip portion on the first outer surface portion of the chip adjacent the chip pads, and wherein the film is continuous over the exposed chip portion.

32. The method according to claim 21 further comprising a step of encapsulating the chip, film, and carrier in an encapsulating material.

* * * * *